(12) United States Patent  
Edwards et al.

(10) Patent No.: US 9,831,231 B2  
(45) Date of Patent: Nov. 28, 2017

(54) ESD PROTECTION CIRCUIT WITH PLURAL AVALANCHE DIODES

(71) Applicant: Texas Instruments Incorporated, Dallas, TX (US)

(72) Inventors: Henry L. Edwards, Garland, TX (US); Akram A. Salman, Plano, TX (US); Lili Yu, Cambridge, MA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/952,124

(22) Filed: Nov. 25, 2015

(65) Prior Publication Data

US 2016/0079228 A1     Mar. 17, 2016

Related U.S. Application Data

(62) Division of application No. 14/222,850, filed on Mar. 24, 2014, now Pat. No. 9,231,403.

(51) Int. Cl.
| | |
|---|---|
| H01L 23/62 | (2006.01) |
| H01L 27/02 | (2006.01) |
| H02H 9/04 | (2006.01) |
| H01L 21/8222 | (2006.01) |
| H01L 29/08 | (2006.01) |
| H01L 29/10 | (2006.01) |
| H01L 29/732 | (2006.01) |
| H01L 29/735 | (2006.01) |
| H01L 29/861 | (2006.01) |
| H01L 21/8224 | (2006.01) |
| H01L 29/66 | (2006.01) |

(52) U.S. Cl.
CPC ...... *H01L 27/0262* (2013.01); *H01L 21/8222* (2013.01); *H01L 21/8224* (2013.01); *H01L 27/0255* (2013.01); *H01L 27/0259* (2013.01); *H01L 27/0288* (2013.01); *H01L 29/0804* (2013.01); *H01L 29/0821* (2013.01); *H01L 29/1004* (2013.01); *H01L 29/66113* (2013.01); *H01L 29/732* (2013.01); *H01L 29/735* (2013.01); *H01L 29/861* (2013.01); *H02H 9/046* (2013.01)

(58) Field of Classification Search
CPC .. H01L 27/0248; H01L 21/8222; H01L 29/73
See application file for complete search history.

(56) References Cited

U.S. PATENT DOCUMENTS

| | | | | |
|---|---|---|---|---|
| 4,047,220 A | * | 9/1977 | Ferro | H01L 27/0825 257/500 |
| 5,151,085 A | * | 9/1992 | Sakurai | A61B 8/546 310/316.02 |
| 6,304,126 B1 | | 10/2001 | Berthiot | |
| 6,472,286 B1 | | 10/2002 | Yu | |

(Continued)

*Primary Examiner* — Dale E Page  
*Assistant Examiner* — Wasiul Haider  
(74) *Attorney, Agent, or Firm* — Tuenlap D. Chan; Charles A. Brill; Frank D. Cimino

(57) ABSTRACT

An electrostatic discharge (ESD) protection circuit (FIG. 3C) is disclosed. The circuit includes a bipolar transistor (304) having a base, collector, and emitter. Each of a plurality of diodes (308-316) has a first terminal coupled to the base and a second terminal coupled to the collector. The collector is connected to a first terminal (V+). The emitter is connected to a first power supply terminal (V−).

30 Claims, 7 Drawing Sheets

(56) References Cited

U.S. PATENT DOCUMENTS

| | | |
|---|---|---|
| 6,635,930 B1 | 10/2003 | Hauptmann et al. |
| 2001/0043449 A1 | 11/2001 | Okushima |
| 2008/0087918 A1* | 4/2008 | Arendt ................ H01L 29/0692 |
| | | 257/197 |
| 2009/0262476 A1 | 10/2009 | Millikararjunaswamy |
| 2010/0214704 A1* | 8/2010 | Lamey ................ H01L 27/0255 |
| | | 361/56 |
| 2011/0096446 A1 | 4/2011 | Croft |
| 2011/0248383 A1* | 10/2011 | Ren ..................... H01L 27/0259 |
| | | 257/577 |
| 2013/0320396 A1 | 12/2013 | Salman et al. |
| 2014/0167106 A1 | 6/2014 | Salcedo |

\* cited by examiner

ESD PROTECTION CIRCUIT WITH PLURAL AVALANCHE DIODES

CROSS REFERENCE TO RELATED APPLICATIONS

Under 35 U.S.C. §§120, 121, this divisional application claims priority to and benefits of U.S. patent application Ser. No. 14/222,850 (TI-74239), filed on Mar. 24, 2014, the entirety of which is incorporated herein by reference.

BACKGROUND

Embodiments of the present embodiments relate to an electrostatic discharge (ESD) protection circuit having a primary discharge device and plural avalanche diodes. Preferred embodiments of the circuit are intended for use at input, output, input-output, or power supply terminals of an integrated circuit.

Referring to FIG. 1A, there is an ESD protection circuit of the prior art as disclosed by Yu in U.S. Pat. No. 6,472,286. The circuit of FIG. 1A is a cross section of a multi finger NPN bipolar transistor as described at col. 3, line 31 through col. 4, line 8. The circuit is fabricated on a P-type substrate 10 with a heavily doped N+ layer 12. An N-type layer 14 is formed over layer 12. A P-type base region 24 is formed at a surface of the substrate 10 and connected to P+ region 22. An N+ emitter region 26 is formed within base region 24. A deep N+ region 16 is connected to N+ layer 12 and serves as a collector surface contact. Surface contacts 18, 20, and 28 for respective collector, base, and emitter regions are formed over the surface of the substrate 10.

FIG. 1B discloses a typical current-voltage characteristic of a bipolar NPN transistor as illustrated at FIG. 1A (col. 1, lines 31-61). The wave form illustrates three points of interest for a bipolar NPN transistor characteristic. First is the initial collector-base breakdown voltage BVcbo, which may also be referred to as the collector-base avalanche threshold, first breakdown, or Vt1, It1. The second point is BVceo which may also be referred to as the snapback voltage. The third point is Vt2, It2, which is the transition point between NPN avalanche conduction and second breakdown.

There are several problems with the circuit of FIG. 1A and the associated current-voltage characteristic of FIG. 1B. First, BVcbo is approximately 18 V and may exceed the damage threshold (Vdam) of contemporary integrated circuits the ESD protection circuit is to protect. Second, BVceo is approximately 8 V and may be less than the operating voltage of the integrated circuit the ESD protection circuit is to protect, thereby causing electrical overstress (EOS) after an ESD event. Finally, the deep N+ collector contact region 16 of FIG. 1A must be spaced apart from P+ base contact region 22 to avoid avalanche conduction and to provide sufficient area for lateral diffusion in subsequent high temperature processing steps of the integrated circuit. Various embodiments of the present disclosure are directed to solving these and other problems and improving operation of the ESD protection circuit without increasing process complexity.

SUMMARY

In a preferred embodiment of the present disclosure, an electrostatic discharge (ESD) protection circuit is disclosed. The ESD protection circuit includes a bipolar transistor having a base, collector, and emitter. Each of a plurality of diodes has a first terminal coupled to the base and has a second terminal coupled to the collector. A first terminal is connected to the collector. A first power supply terminal is connected to the emitter.

DETAILED DESCRIPTION

The preferred embodiments of the present disclosure provide significant advantages over electrostatic discharge (ESD) protection circuits of the prior art as will become evident from the following detailed description.

Figure 1A:
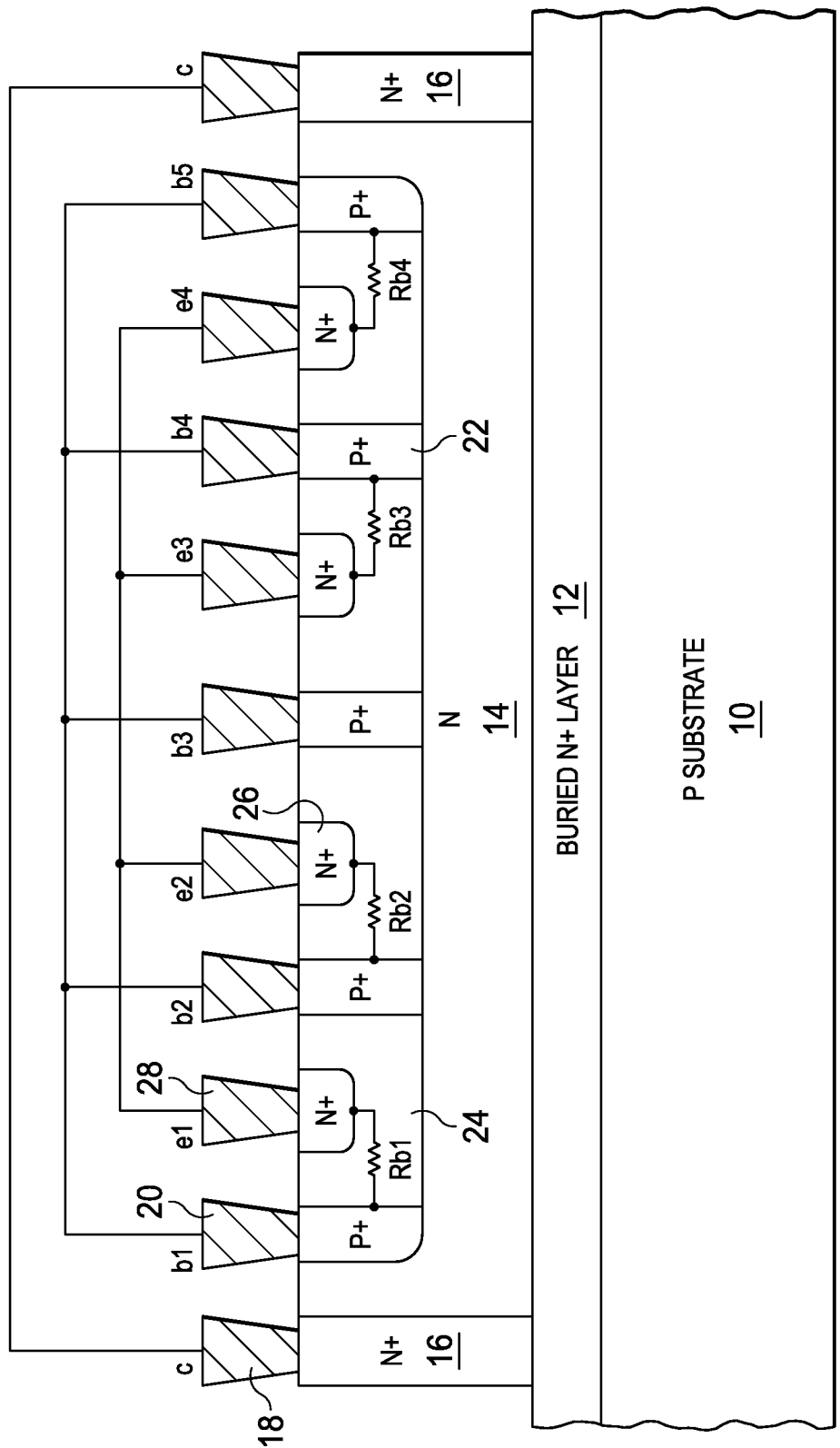
FIG. 1A is a circuit diagram of an electrostatic discharge (ESD) protection circuit of the prior art.
Figure 1B:
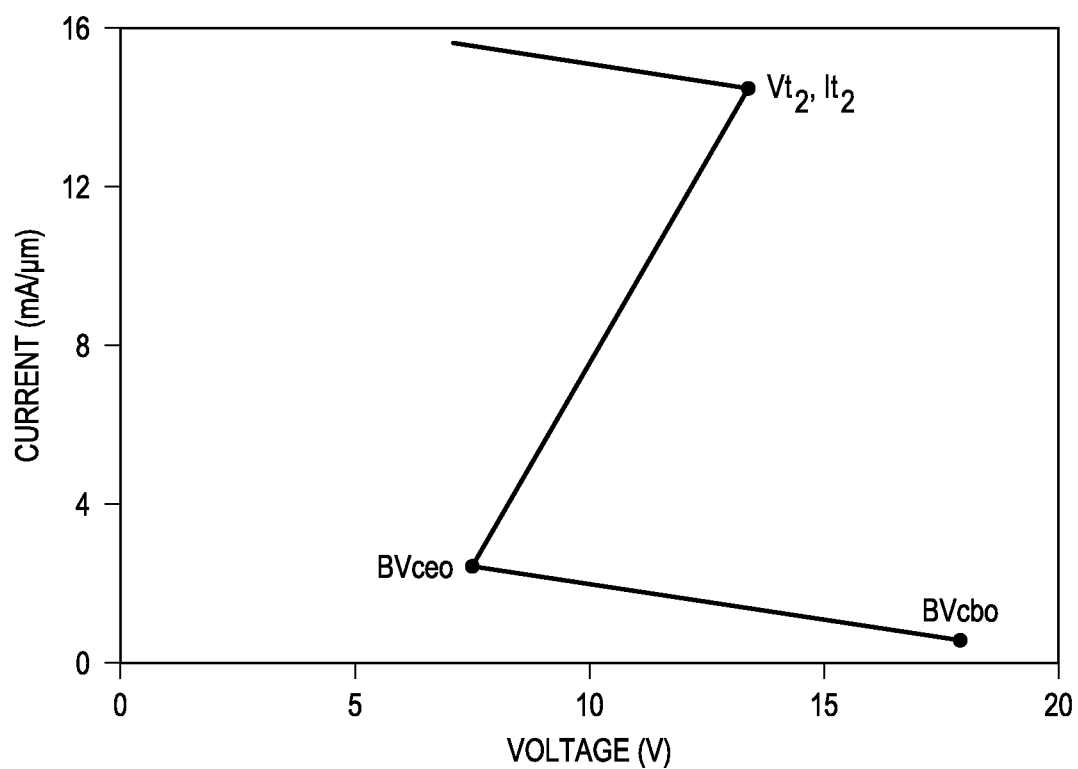
FIG. 1B is a current-voltage (IV) characteristic of a bipolar NPN ESD protection transistor as illustrated at FIG. 1A.
Figure 2:
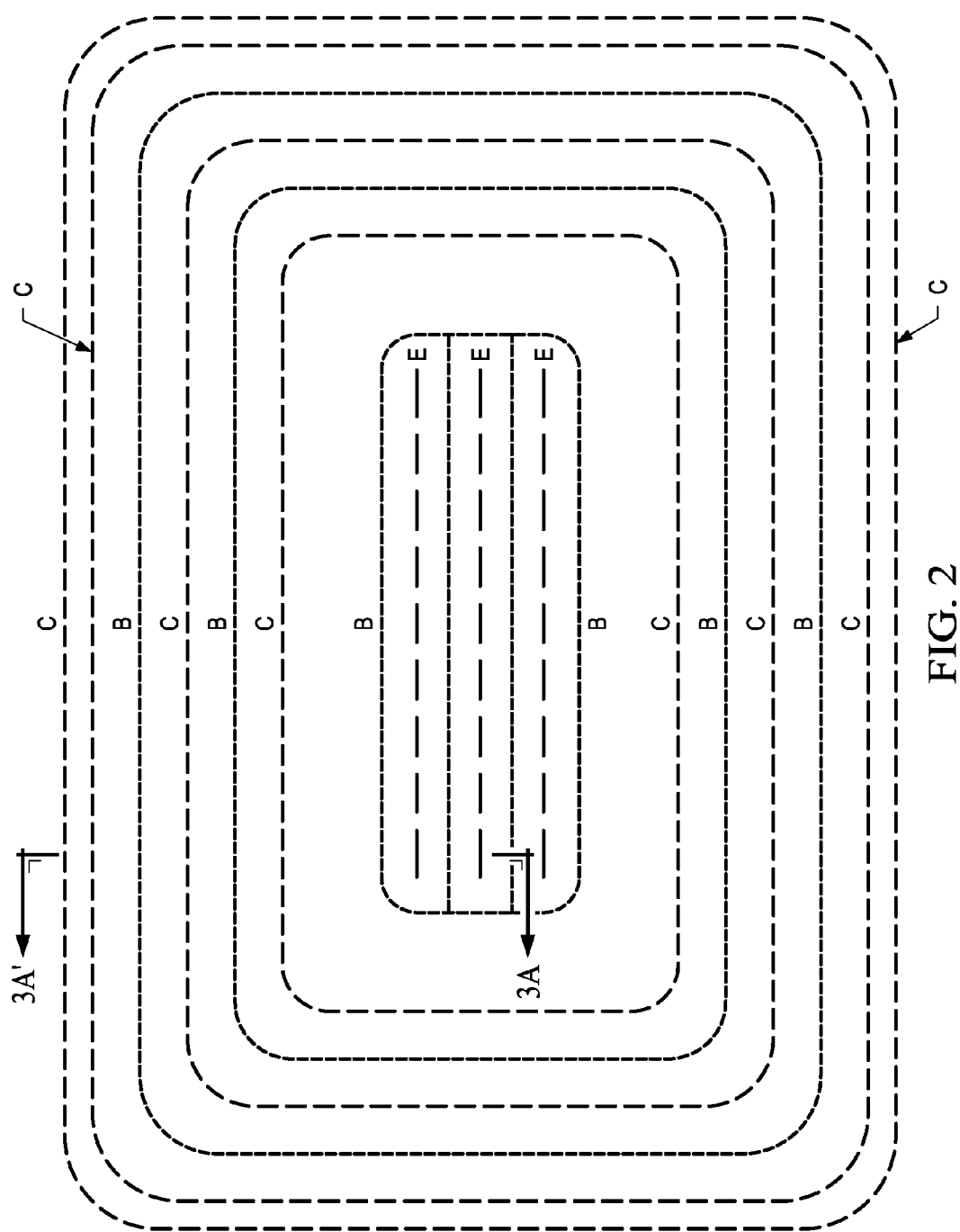
FIG. 2 is a simplified plan view of a first embodiment of an ESD protection circuit of the present disclosure.

Referring to FIG. 2, there is a simplified plan view of a first embodiment of an ESD protection circuit of the present disclosure. The embodiment of FIG. 2 will be discussed in greater detail with reference to FIGS. 3A and 3B taken along a cross sectional plane 3A-3A'. Here and in the following discussion, the same reference numerals are used to indicate substantially the same features. The protection circuit of FIG. 2 is preferably formed on an integrated circuit substrate and includes plural vertical bipolar transistors. The bipolar transistors may be NPN or PNP as will be evident to one of ordinary skill in the art having access to the instant specification. The bipolar transistors include respective parallel emitter (E) and base (B) regions formed at a face of the substrate and at the center of the protection circuit. The parallel emitter and base regions are surrounded by concentric and interdigitated collector (C) and base (B) regions. The concentric and interdigitated collector and base regions are closely spaced to form a plurality of PN diodes between collector and base regions of the plural vertical bipolar transistors.

Figure 3A:
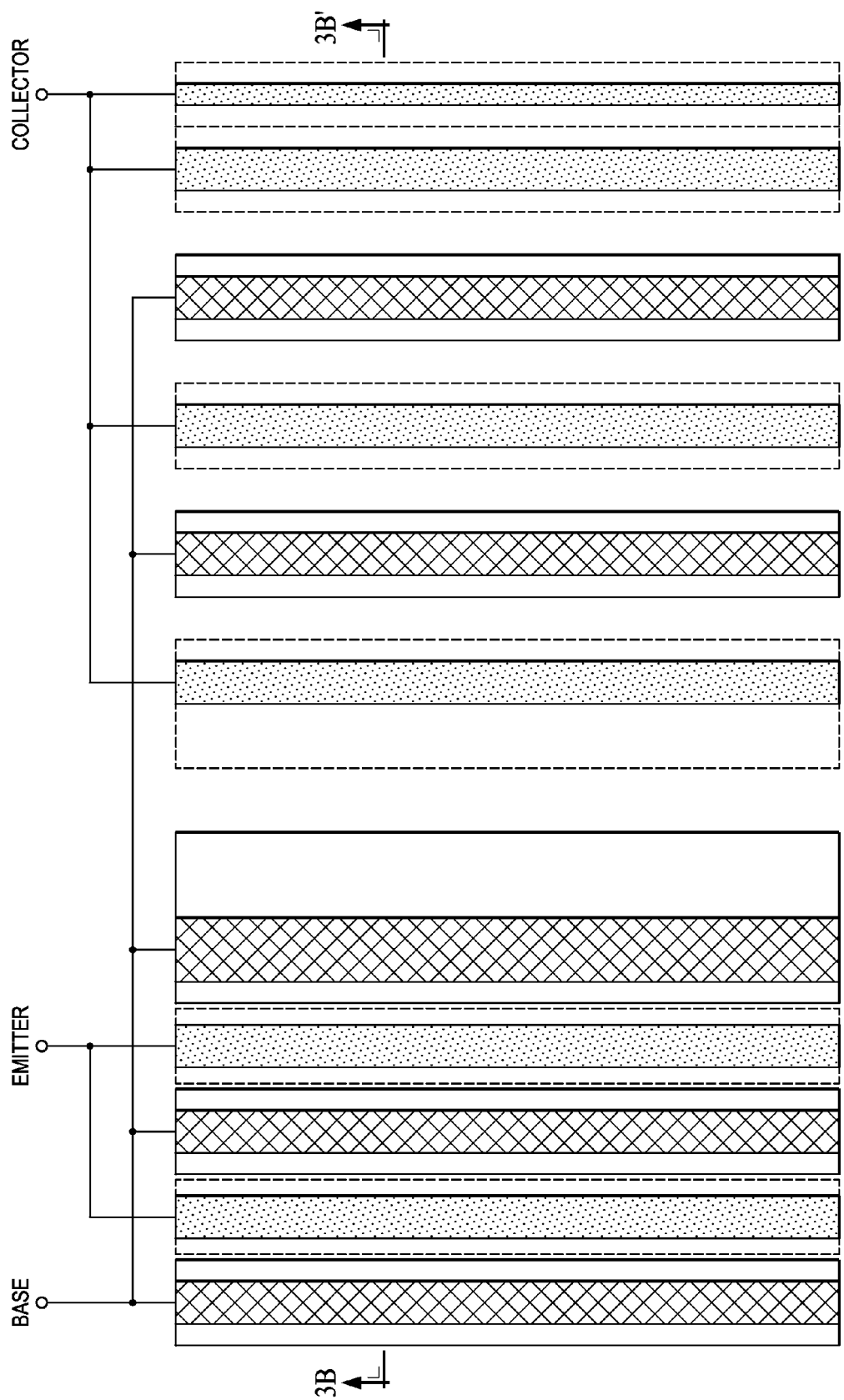
FIG. 3A is a plan view of the embodiment of FIG. 2 along the line 3A-3A'.
Figure 3B:
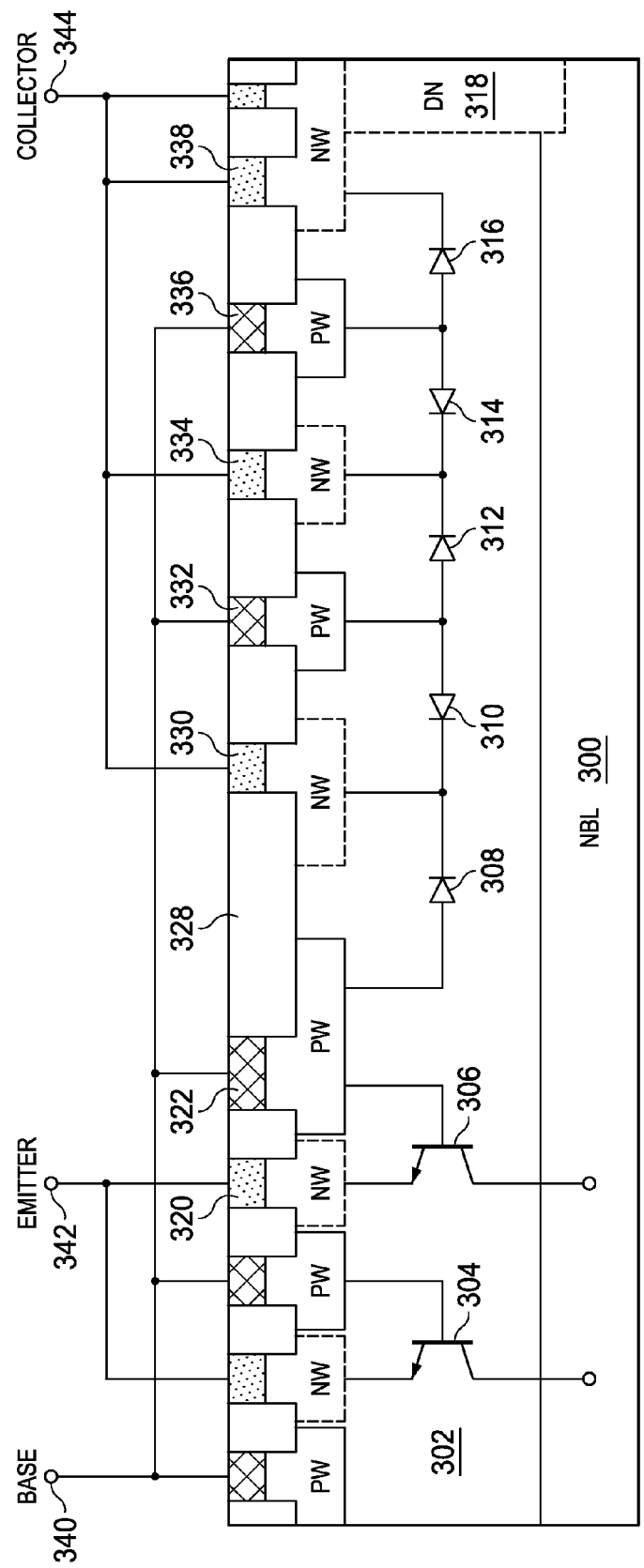
FIG. 3B is a cross sectional view of the embodiment of FIG. 3A along the line 3B-3B'.

Turning now to FIGS. 3A and 3B, there are corresponding plan and cross sectional views of the embodiment of the ESD protection circuit of FIG. 2 along the lines 3A-3A' and 3B-3B', respectively. FIGS. 3A-3B will be discussed with reference to the schematic diagram at FIG. 3C. FIG. 3A is a detailed plan view of the embodiment of FIG. 2 at line 3A-3A'. Base 340, emitter 342, and collector 344 regions are shown connected by lines preferably indicating metallization connected to respective semiconductor regions by vias as is known in the art. N+ semiconductor regions such as 320, 330, 334, and 338 are formed at a surface of semiconductor substrate 302 as indicated by dotted infill. P+ semiconductor regions such as 322, 332, and 336 are formed at the surface of semiconductor substrate 302 as indicated by lined infill. The N+ and P+ regions are isolated from each other by shallow trench isolation (STI) regions such as 328 indicated by rectangles having no infill. Active regions may also be separated by local oxidation of silicon (LOCOS) as is known in the art. Each N+ region is connected to a respective shallow N-well (NW) region. Likewise, each P+ region is connected to a respective shallow P-well (PW) region. N-type buried layer (NBL) 300 is formed below the surface of substrate 302. NBL 300 is electrically connected to collector terminal 344 by deep N+ implant (DN) 318. NPN bipolar transistors 304 and 306 are connected in parallel and have respective vertical collector-emitter current paths formed between NBL 300 and emitter 342. Base regions of NPN transistors 304 and 306 are connected to base terminal 340 through substrate 302, P+, and shallow P-well regions. Substrate region 302 is electrically isolated from other regions of the integrated circuit by NBL 300 and surrounding deep N+ implant 318.

Diodes 308 through 316 are formed between adjacent PW and NW regions. The space between adjacent PW and NW regions of each of diodes 310 through 316 is substantially the same and less than the PW to NW space of diode 308. Diodes 310 through 316, therefore, have a lower avalanche threshold than diode 308. Resistors 360 through 368 represent the parasitic resistance in series with diodes 308 through 316, respectively.

Operation of the ESD protection circuit of FIGS. 3A through 3B will now be described with reference to the schematic diagram of FIG. 3C and the transmission line pulse (TLP) wave forms of FIG. 4. FIG. 4 shows measured TLP wave forms for both 100 ns and 500 ns pulse widths with a positive voltage corresponding to a positive voltage at terminal 344 (V+) with respect to terminal 342 (V−). During normal circuit operation NPN transistors 304 and 306 are both off, since they receive no base current. As voltage V+ becomes more positive and exceeds the avalanche threshold of diodes 310-316, current flows through series resistors 362-368, respectively, and into the base of NPN transistors 304 and 306. NPN transistors 304 and 306, therefore, begin bipolar conduction at 31 V. For the 100 ns wave form, collector current increases through NPN transistors 304 and 306 as collector-emitter voltage (Vice) decreases to a snapback or holding voltage of 18 V at 0.6 A. As current becomes increasingly positive, the 100 ns TLP waveform exhibits a positive slope corresponding to resistance of the current paths and parasitic circuit resistance. The ESD protection circuit functions in a similar manner for the 500 ns TLP wave form except that the snapback or holding voltage remains slightly greater than 25 V. This is due to the high-injection effect, where the injected minority carrier density (electrons) in the base region approaches the base impurity concentration, thereby decreasing emitter efficiency. Emitter efficiency is further degraded by emitter crowding, resulting in higher current density at the emitter periphery than at the center of the emitter. After snapback, the 500 ns TLP wave form also exhibits a positive slope corresponding to resistance of the current paths and parasitic circuit resistance.

Figure 3C:
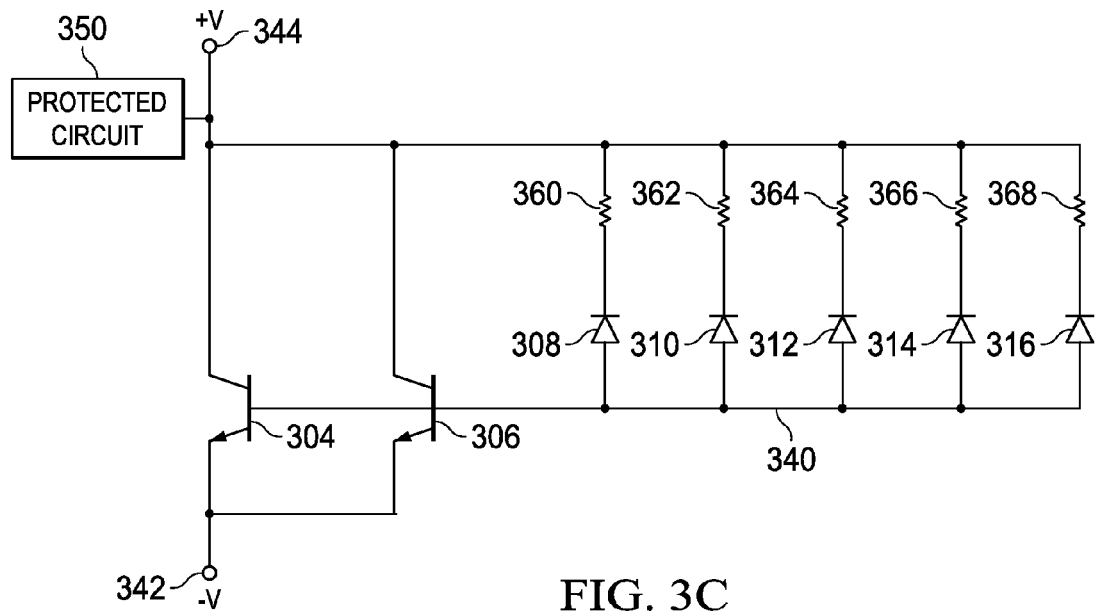
FIG. 3C is a schematic diagram of the embodiment of FIGS. 3A and 3B.
Figure 4:
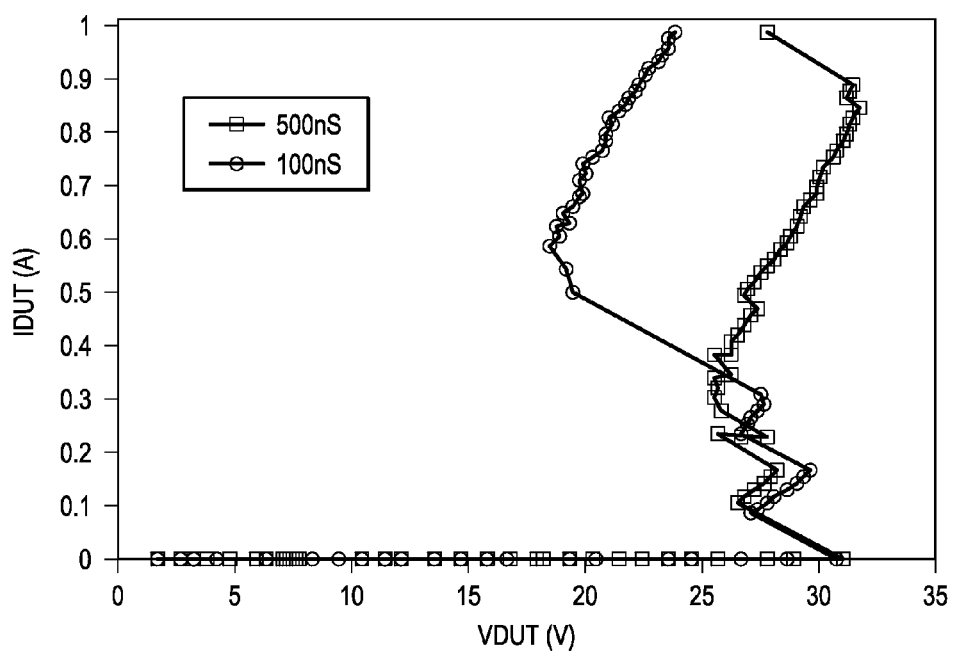
FIG. 4 is a measured transmission line pulse (TLP) wave form of the first embodiment of the present disclosure for 500 ns and 100 ns pulse widths.

The ESD protection circuit of FIGS. 3A-3C offers several significant advantages over circuits of the prior art. First, only a single deep N+ collector implant 318 is necessary to surround NPN transistors 304 and 306 as well as diodes 308 through 316. This results in a significant area reduction for the ESD protection circuit. Second, diodes 308 through 316 are formed in the same isolated base region 302 as NPN transistors 304 and 306. This advantageously improves NPN turn on. Moreover, diode anode terminals 332 and 336 are connected in metal to NPN P+ base contacts, so there is negligible lateral voltage drop in substrate 302 due to base current. Third, adjacent PW to NW space is adjusted to set the avalanche threshold for diodes 310 through 316. This advantageously sets the trigger voltage of the ESD protection circuit and assures it will be less than the damage threshold of protected circuit 350. Fifth, diode anode and cathode terminals are shared between adjacent diodes, thereby producing a further area reduction. Finally, NPN transistors 304 and 306 are advantageously designed with multiple parallel emitter fingers as shown at FIGS. 2 and 3A. This advantageously increases the emitter perimeter to area ratio, thereby increasing emitter efficiency under high injection.

Figure 5:
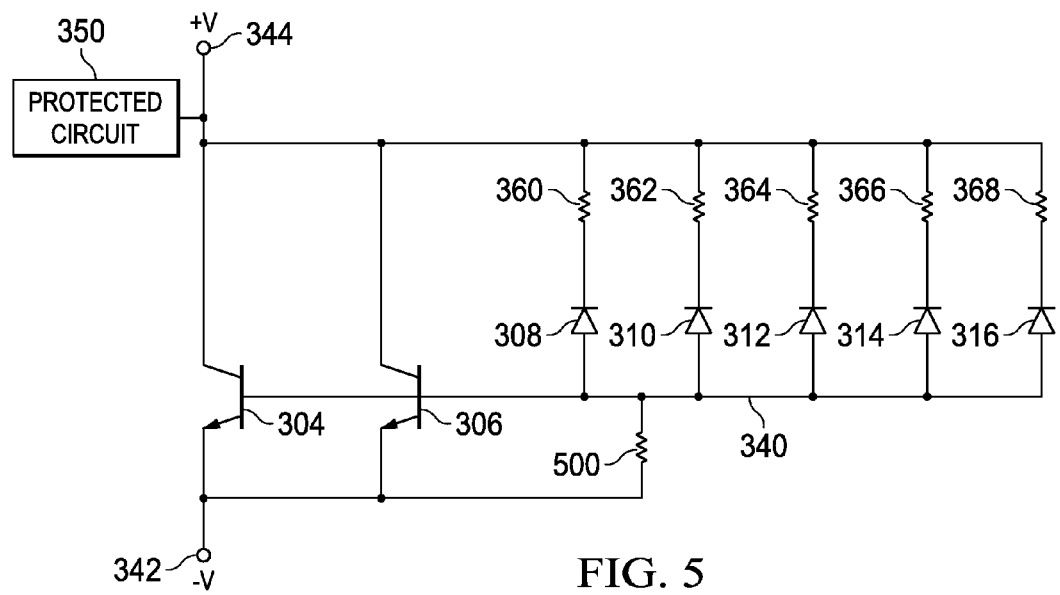
FIG. 5 is a schematic diagram of a second embodiment of an ESD protection circuit of the present disclosure.

Turning now to FIG. 5, there is a schematic diagram of a second embodiment of an ESD protection circuit of the present disclosure. This embodiment is the same as previously described with regard to FIGS. 2 and 3A-3C except that resistor 500 is added. Resistor 500 is a base-emitter shunt resistor for NPN transistors 304 and 306. In general, when resistor 500 is large, for example greater than 1 kΩ the circuit functions in the same manner as described at FIGS. 3A-3C. When resistor 500 is small, for example a metal shunt, the circuit functions as parallel avalanche diodes 310 through 316. Thus, the snapback or holding voltage of the ESD protection circuit of FIG. 5 may be adjusted by selecting an appropriate value of resistor 500. This advantageously provides a method of independently selecting the trigger voltage and the snapback or holding voltage of the ESD protection circuit. The trigger voltage of the circuit is selected by setting the avalanche threshold of diodes 310-316 as previously described. The snapback or holding voltage of the circuit is selected by an appropriate value of resistor 500 and is preferably between BVceo and BVcbo of the NPN transistors. This independent programmability is suitable for a wide range of ESD protection circuit applications having a variety of operating voltages.

Figure 6:
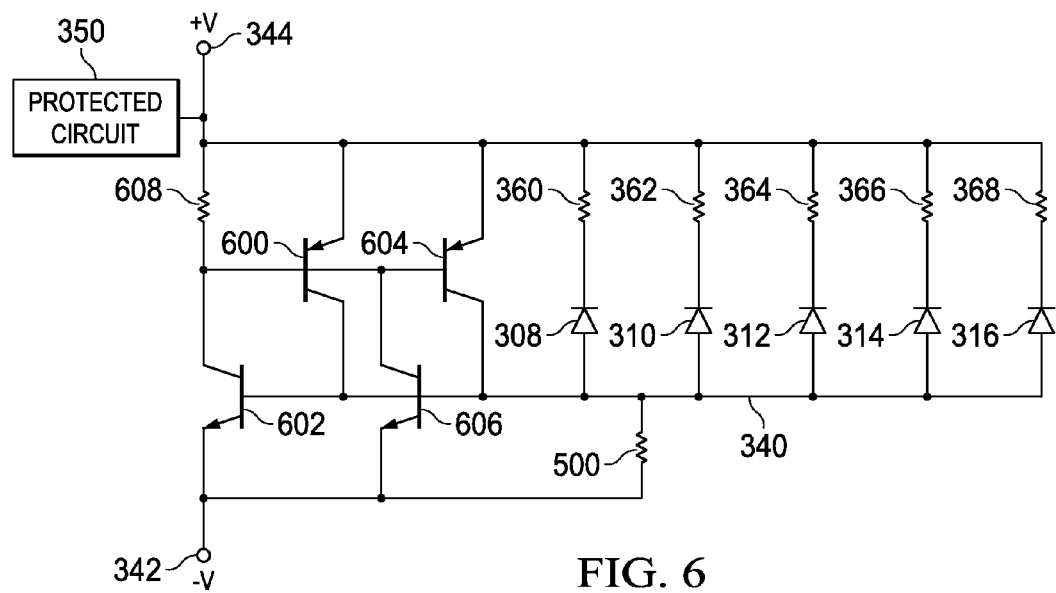
FIG. 6 is a schematic diagram of a third embodiment of an ESD protection circuit of the present disclosure.

Referring now to FIG. 6, there is a schematic diagram of a third embodiment of an ESD protection circuit of the present disclosure. This embodiment is similar to the previously described embodiment of FIGS. 2 and 3A-3C except that NPN transistors 304 and 306 are replaced by semiconductor controlled rectifiers (SCRs). In particular, NPN transistor 304 is replaced by a first SCR including PNP transistor 600 and NPN transistor 602. NPN transistor 306 is replaced by a second SCR including PNP transistor 604 and NPN transistor 606. Resistor 500 is a base-emitter shunt resistor for NPN transistors 602 and 606. Resistor 608 is a base-emitter shunt resistor for PNP transistors 600 and 604. Resistors 500 and 608 serve several purposes. First, both resistors are selected to assure the SCR will not latch during normal circuit operation. Second, resistors 500 and 608 are independently selected to match the current gain of respective NPN and PNP transistors. This provides a method of setting the SCR holding voltage even with very different current gains of the NPN and PNP transistors. Finally, the trigger voltage of the circuit is selected by setting the avalanche threshold of diodes 310-316 as previously described. The holding voltage of the circuit is selected by appropriate values of resistors 500 and 608 and is preferably between a forward bias diode drop and the avalanche threshold of diodes 310-316. This advantageously provides a method of independently selecting the trigger voltage and the holding voltage of the circuit. Moreover, for low voltage applications the SCRs may dissipate much less power due to a lower current-voltage product and, therefore, generate much less heat than embodiments having only NPN transistors. The independent programmability is suitable for a wide range of ESD protection circuit applications having a variety of operating voltages.

In view of the foregoing explanation, it is important that the trigger or switching voltage of various embodiments of the ESD protection circuit is less than the damage threshold (Vdam) of the protected circuit 350 (FIGS. 3C, 5, and 6). It is also important that the snapback or holding voltage of the ESD protection circuit is greater than the operating voltage of the protected circuit. This assures that application of an ESD pulse while power is applied to protected circuit 350 will not result in failure of the ESD protection circuit due to electrical overstress (EOS) from the power supply.

Still further, while numerous examples have thus been provided, one skilled in the art should recognize that various modifications, substitutions, or alterations may be made to the described embodiments while still falling within the inventive scope as defined by the following claims. Moreover, it is to be understood that the present disclosure may discharge ESD current to Vss, Vdd, or other suitable terminals in response to the polarity and terminal combination of the ESD pulse. Other combinations will be readily apparent to one of ordinary skill in the art having access to the instant specification.

What is claimed is:

1. A method for fabricating an electrostatic discharge (ESD) device, the method comprising:
    forming an emitter region of a bipolar transistor near a top surface of a substrate;
    forming a first base region of the bipolar transistor near the top surface of the substrate, the first base region positioned adjacent to the emitter region;
    forming a second base region of the bipolar transistor near the top surface of the substrate, the second base region separated and discontinued from the first base region; and
    forming a collector region of the bipolar transistor near the top surface of the substrate, the collector region positioned adjacent to the first base region to define a first avalanche diode, and the collector region interdigitating with the second base region to define a second avalanche diode,
    wherein the forming the second base region includes forming a base ring region surrounding the first base region and the emitter region.

2. The method of claim 1, wherein the forming the emitter region includes:
    interdigitating the emitter region with the first base region; and
    separating the emitter region from the second base region and the collector region by the first base region.

3. The method of claim 1, wherein the forming the first base region includes surrounding the emitter region with the first base region while free of abutting the first base region.

4. The method of claim 1, wherein the forming the collector region includes forming a collector ring region surrounding the first base region and the emitter region.

5. The method of claim 1, wherein:
    the forming the collector region includes forming a collector ring region surrounding the first base region and the emitter region; and
    the forming the second base region includes forming a base ring region surrounding the first base region and the emitter region and concentric with the collector ring region.

6. The method of claim 5, wherein the forming the base ring region includes surrounding the collector ring region with the base ring region.

7. The method of claim 5, wherein the second avalanche diode has an anode extending from the base ring region and a cathode extending from the collector ring region.

8. The method of claim 1, wherein:
    the forming the collector region includes forming collector ring regions surrounding the first base region and the emitter region;
    the forming the second base region includes forming base ring regions surrounding the first base region and the emitter region, the base ring regions interdigitating with the collector ring regions.

9. The method of claim 8, wherein the second avalanche diode includes a plurality of third avalanche diodes, each formed by one pair of the interdigitated collector ring regions and the base ring regions.

10. The method of claim 1, further comprising:
    forming a buried layer formed in the substrate; and
    forming a vertical deep implant region connecting the collector region and the buried layer.

11. The method of claim 10, further comprising:
    forming a vertical bipolar transistor by including the emitter region, the first base region, and the buried layer while excluding the second base region.

12. The method of claim 1, wherein the second avalanche diode has a lower avalanche threshold than the first avalanche diode.

13. The method of claim 1, wherein the forming the collector region includes:
    spacing the collector region apart from the first base region by a first distance; and
    spacing the collector region apart from the second base region by a second distance less than the first distance.

14. A method for fabricating an integrated circuit, the method comprising:
    forming a circuit with a protected terminal on a substrate;
    forming an emitter region of a bipolar transistor near a top surface of the substrate;
    forming a first base region of the bipolar transistor near the top surface of the substrate, the first base region positioned adjacent to the emitter region;
    forming a second base region of the bipolar transistor near the top surface of the substrate, the second base region separated and discontinued from the first base region;
    forming a collector region of the bipolar transistor near the top surface of the substrate, the collector region positioned adjacent to the first base region to define a first avalanche diode, and the collector region interdigitating with the second base region to define a second avalanche diode; and
    coupling the collector region to the protected terminal of the circuit,
    wherein the forming the second base region includes forming a base ring region surrounding the first base region and the emitter region.

15. The method of claim 14, wherein the forming the emitter region includes:
    interdigitating the emitter region with the first base region; and
    separating the emitter region from the second base region and the collector region by the first base region.

16. The method of claim 14, wherein the forming the first base region includes surrounding the emitter region with the first base region while free of abutting the first base region.

17. The method of claim 14, wherein the forming the collector region includes forming a collector ring region surrounding the first base region and the emitter region.

18. The method of claim 14, wherein:
the forming the collector region includes forming a collector ring region surrounding the first base region and the emitter region; and
the forming the second base region includes forming a base ring region surrounding the first base region and the emitter region and concentric with the collector ring region.

19. The method of claim 18, wherein the forming the base ring region includes surrounding the collector ring region with the base ring region.

20. The method of claim 18, wherein the second avalanche diode has an anode extending from the base ring region and a cathode extending from the collector ring region.

21. The method of claim 14, wherein:
the forming the collector region includes forming collector ring regions surrounding the first base region and the emitter region;
the forming the second base region includes forming base ring regions surrounding the first base region and the emitter region, the base ring regions interdigitating with the collector ring regions.

22. The method of claim 21, wherein the second avalanche diode includes a plurality of third avalanche diodes, each formed by one pair of the interdigitated collector ring regions and the base ring regions.

23. The method of claim 14, further comprising:
forming a buried layer formed in the substrate; and
forming a vertical deep implant region connecting the collector region and the buried layer.

24. The method of claim 23, further comprising:
forming a vertical bipolar transistor by including the emitter region, the first base region, and the buried layer while excluding the second base region.

25. The method of claim 14, wherein the second avalanche diode has a lower avalanche threshold than the first avalanche diode.

26. The method of claim 14, wherein the forming the collector region includes:
spacing the collector region apart from the first base region by a first distance; and
spacing the collector region apart from the second base region by a second distance less than the first distance.

27. A method for fabricating an electrostatic discharge (ESD) device, the method comprising:
forming an emitter region of a bipolar transistor near a top surface of a substrate;
forming a first base region of the bipolar transistor near the top surface of the substrate, the first base region positioned adjacent to the emitter region;
forming a second base region of the bipolar transistor near the top surface of the substrate, the second base region separated from the first base region and having a base ring region surrounding the first base region and the emitter region; and
forming a collector region of the bipolar transistor near the top surface of the substrate, the collector region including a collector ring region surrounding the first base region and the emitter region, the collector region positioned adjacent to the first base region to define a first avalanche diode, and the collector region interdigitating with the second base region to define a second avalanche diode.

28. A method for fabricating an electrostatic discharge (ESD) device, the method comprising:
forming an emitter region of a bipolar transistor near a top surface of a substrate;
forming a first base region of the bipolar transistor near the top surface of the substrate, the first base region positioned adjacent to the emitter region;
forming a second base region of the bipolar transistor near the top surface of the substrate, the second base region separated from the first base region and having a base ring region surrounding the first base region and the emitter region; and
forming a collector region of the bipolar transistor near the top surface of the substrate, the collector region positioned adjacent to the first base region to define a first avalanche diode, and the collector region interdigitating with the second base region to define a second avalanche diode.

29. A method for fabricating an integrated circuit, the method comprising:
forming a circuit with a protected terminal on a substrate;
forming an emitter region of a bipolar transistor near a top surface of the substrate;
forming a first base region of the bipolar transistor near the top surface of the substrate, the first base region positioned adjacent to the emitter region;
forming a second base region of the bipolar transistor near the top surface of the substrate, the second base region separated from the first base region and having a base ring region surrounding the first base region and the emitter region;
forming a collector region of the bipolar transistor near the top surface of the substrate, the collector region positioned adjacent to the first base region to define a first avalanche diode, and the collector region interdigitating with the second base region to define a second avalanche diode; and
coupling the collector region to the protected terminal of the circuit.

30. A method for fabricating an integrated circuit, the method comprising:
forming a circuit with a protected terminal on a substrate;
forming an emitter region of a bipolar transistor near a top surface of the substrate;
forming a first base region of the bipolar transistor near the top surface of the substrate, the first base region positioned adjacent to the emitter region;
forming a second base region of the bipolar transistor near the top surface of the substrate, the second base region separated from the first base region and having a base ring region surrounding the first base region and the emitter region;
forming a collector region of the bipolar transistor near the top surface of the substrate, the collector region including a collector ring region surrounding the first base region and the emitter region, the collector region positioned adjacent to the first base region to define a first avalanche diode, and the collector region interdigitating with the second base region to define a second avalanche diode; and
coupling the collector region to the protected terminal of the circuit.

* * * * *